United States Patent
Chang et al.

(10) Patent No.: US 9,935,637 B2
(45) Date of Patent: Apr. 3, 2018

(54) SYSTEMS AND METHODS FOR FPGA DEVELOPMENT AND OPERATION

(71) Applicant: NATIONAL INSTRUMENTS CORPORATION, Austin, TX (US)

(72) Inventors: Chen Chang, Fremont, CA (US); Kevin B. Camera, Walnut Creek, CA (US); Alexander Williams, Oakland, CA (US); Brian Jenkins, Walnut Creek, CA (US); Ellery Cochell, Hayward, CA (US); Robert W. Brodersen, Berkeley, CA (US); John C. Wawrzynek, Berkeley, CA (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 0 days.

(21) Appl. No.: 14/619,888

(22) Filed: Feb. 11, 2015

(65) Prior Publication Data

US 2015/0229310 A1  Aug. 13, 2015

Related U.S. Application Data

(60) Provisional application No. 61/938,639, filed on Feb. 11, 2014.

(51) Int. Cl.
 *G06F 7/38* (2006.01)
 *H03K 19/173* (2006.01)
 *H03K 19/177* (2006.01)
 *G06F 17/50* (2006.01)

(52) U.S. Cl.
 CPC ... *H03K 19/17728* (2013.01); *G06F 17/5054* (2013.01); *H03K 19/17756* (2013.01)

(58) Field of Classification Search
 None
 See application file for complete search history.

(56) References Cited

U.S. PATENT DOCUMENTS

| | | | | |
|---|---|---|---|---|
| 7,260,794 B2* | 8/2007 | Butts | ................... | G06F 17/5027 703/13 |
| 7,454,658 B1* | 11/2008 | Baxter | ........... | G01R 31/318519 326/41 |
| 7,512,728 B2* | 3/2009 | Tseng | ...................... | G06F 13/22 709/236 |
| 7,761,690 B2* | 7/2010 | Chou | ................... | G06F 9/30181 712/214 |
| 7,805,593 B1* | 9/2010 | Donlin | ................ | G06F 11/3466 712/227 |
| 8,099,271 B2* | 1/2012 | Schubert | .......... | G01R 31/31704 703/16 |

(Continued)

*Primary Examiner* — Anh Tran
(74) *Attorney, Agent, or Firm* — Meyertons Hood Kivlin Kowert & Goetzel, P.C.

(57) ABSTRACT

A design environment for FPGA applications enables configuration of an FPGA platform to include a user design and one or more interface units, which the user design can use to access one or more external modules/devices without needing any particular knowledge of the structure and operation of such modules/devices. The interface unit corresponding to an external device/module, under the control of an operating environment, can establish a communication between the user design and the external module/device. An external processing module can use an interface unit to monitor and/or control a user design.

15 Claims, 4 Drawing Sheets

(56) References Cited

U.S. PATENT DOCUMENTS

| | | | | |
|---|---|---|---|---|
| 8,281,280 B2 * | 10/2012 | Chang | ............... | G06F 17/5027 |
| | | | | 716/106 |
| 8,356,272 B2 * | 1/2013 | Chene | ............... | G06F 17/5027 |
| | | | | 716/106 |
| 8,595,683 B1 * | 11/2013 | de Buren | ............ | G06F 17/5054 |
| | | | | 326/37 |
| 8,719,762 B2 * | 5/2014 | Chang | ............... | G06F 17/5027 |
| | | | | 716/136 |
| 9,304,730 B2 * | 4/2016 | Bittner | ..................... | G06F 3/14 |

* cited by examiner

SYSTEMS AND METHODS FOR FPGA DEVELOPMENT AND OPERATION

CROSS-REFERENCE TO RELATED APPLICATION

This application claims priority to and the benefit of, and incorporates herein by reference in its entirety, U.S. Provisional Patent Application No. 61/938,639, entitled "Software API and Operating Environment for FPGA Development Platforms," which was filed on Feb. 11, 2014.

FIELD OF THE INVENTION

This disclosure generally relates to field programmable gate array (FPGA)-based systems and, in particular, to design and operating environments for such systems.

BACKGROUND

FPGA platforms provide many potential advantages over more traditional computing platforms. In a wide range of applications, computations mapped directly to FPGAs can provide higher performance and improved energy efficiency than microprocessor-based systems, digital signal processor (DSP)-based systems, and graphics processing unit (GPU)-based systems. Furthermore, in part because of their high input/output bandwidth and flexible interfaces, FPGA platforms often provide relatively higher bandwidth and lower latency connections to sensors/actuators and to memory systems. FPGA computing platforms, like traditional processor based platforms, are a complex connection of input/output devices, memory, and computing elements (in this case FPGAs, sometimes also including non-FPGA processors). Widespread use of FPGA platforms has not reached its maximum potential, however, in part due to a lack of operating environment and software/hardware interfaces to support easy development of applications. Specifically, designers of programs to be executed using an FPGA unit cannot readily establish communication between the program and external modules/devices that the program may need to access. This lack of software support often results in long and costly application development.

There are several challenges associated with developing and executing applications on FPGA hardware platforms. First, applications to be run on FPGAs need to be translated to logic circuits from a high-level language description of those applications. While this task is generally tractable for regular computational arrays and simple data-paths, many algorithms and computing tasks require complex control, which can be difficult to design and expensive (in terms of FPGA resource requirements) to implement. Second, FPGAs generally provide no native mechanisms for developers to observe the operation of their designs, as needed for design debugging, verification, and tuning. Some FPGA vendors provide logic blocks that are able to capture and display the internal state of an FPGA, but these tools are primitive and only provide low-level signaling information. Third, high-performance interfaces, such as SERES communication blocks or DRAM channels, usually require complex control for initialization and run-time calibration resulting in complex circuit designs, which the developer of the application must provide. The developer often lacks such information, however, and programming such control and communication protocols can be cumbersome and error prone.

SUMMARY

Various embodiments described herein enable systems and methods for application development on FPGA platforms by coupling a traditional software processor and/or an FPGA-based processor with the FPGA platform, and by using the processor to run software (also called operating environment or OE) that interfaces directly with a user design to be executed by one or more FPGA units on the platform. The interface allows the software/OE to observe directly and control the user design. Alternatively or in addition, the interface may also facilitate exchange of information between the user design (e.g., an FPGA application) and an external module/device, without the user (e.g., the application developer) needing any special knowledge of the external module/device. On FPGA devices that do not include a built-in hard processor core, a soft-processor core may be automatically embedded in the FPGA platform.

The interface between a processor core and an FPGA unit may be implemented as a set of state elements (e.g., registers, buffers, FIFOs) that are wired in as part of the application configuration of the FPGA platform. With this arrangement, software running on the processor core can a) take over part of the application that would otherwise need to be implemented as circuits on the FPGA, thereby relieving the developer from having to convert several parts of the application to circuits, b) provide a software interface to developers to observe the evolution of the internal state of the FPGA designs and enable high-level debugging, and c) provide a convenient mechanism through software/OE to control the initialization and run-time calibration and control of system I/O devices and other system-level resources (i.e., certain external modules and/or devices), so that the application running on the FPGA unit can communicate efficiently with external modules/devices.

Various embodiments of an FPGA Platform Studio (hereinafter referred to as "FPS") provide implementations of the above concept—an FPGA system-level, hardware/software co-development environment. Embodiments of the FPS can abstract hardware-specific details away from the end-user and can accelerate the design of the application. The FPS can provide automatic generation of various platform specific hardware interfaces and corresponding software drivers. Months of engineering tasks of converting complex algorithms to implementation can be achieved in a matter of days, all without the user requiring low-level FPGA implementation details, such as high speed I/O interfaces, timing closure, HW/SW interfaces, and IP integration issues (i.e., structural and operational details of external modules/devices). Combined with an FPGA based hardware platform, an FPS design environment can enable a wide range of high-performance real-time applications, including multi-core embedded systems, advanced wireless communication, software-defined radio, high-definition video processing, and high-bandwidth wired network solutions.

Accordingly, in one aspect, a field programmable gate array (FPGA)-based scalable system includes a first FPGA unit having a partition for a user design. The user design, e.g., a design under test, can be loaded and executed in that partition. The first FPGA unit also includes a reconfigurable interface implemented using FPGA reconfigurable circuits. The reconfigurable interface is configured to exchange data with the user design and, to this end, the reconfigurable interface includes a first interface unit. The first FPGA unit also includes a controller configured to establish a first communication channel between the first interface unit and a processing module. The processing module can be a user device such as a personal computer, a laptop, a tablet, a smart phone, etc., or can be a server, and the processing module may be used for debugging and/or controlling the user design. Alternatively or in addition, the controller may establish the first communication channel between the first interface unit and a first external module/device, such as a sensor, an actuator, a controller for such a device, etc., so that the user design can access the external module/device.

In some embodiments, the first interface unit includes one or more of a register, a first in first out (FIFO) buffer, and a random access memory (RAM). Additionally or in the alternative, the first interface unit may be customized for the first FPGA unit, such that the first interface unit includes one or more of a network input/output device, a serial communication device, a buffer, and a memory controller, each of which may be customized for the first FPGA unit or an FPGA platform having the first FPGA unit.

In some embodiments, the reconfigurable interface further includes a second interface unit, and the controller is further configured to establish a second communication channel between the second interface unit and the processing module and/or a second external module. The controller may include one or more of a processor core, a bus, and a bus controller, e.g., a universal asynchronous receiver transmitter (UART), and I²C controller, etc., for establishing the first communication channel. The processor core may include an FPGA based soft processor core and/or a hard processor core.

In some embodiments, the first FPGA unit also includes an input/output (I/O) interface. The FPGA-based system may also include a second FPGA unit, which can be similar to the first FPGA unit or can be different, and an external controller in electrical communication with the first FPGA unit and with the second FPGA unit. The external controller may be configured to access the reconfigurable interface of the first FPGA unit and a reconfigurable interface of the second FPGA unit. Moreover, the external controller may be configured to establish a communication link between the first and second FPGA units through respective I/O interfaces thereof, so that the two FPGA units can efficiently exchange data, control, and other information with each other. The FPGA-based system is generally scalable because, depending on the characteristics of the user design, e.g., the number of computations performed by the user design, performance requirements, etc., two or more FPGA units can be included in the FPGA-based system, and such units can be electrically coupled so as to exchange information with one another for efficient execution of the user design.

In another aspect, a method for analyzing a field programmable gate array (FPGA)-based user design includes the steps of designating a first part of an FPGA unit to execute a user design, and configuring a second part of the FPGA unit as an interface unit for accessing a data element of the user design. The method also includes establishing, by a controller, a communication channel between the interface unit and a processing module, which may be used for monitoring, debugging, and/or controlling the user design. The interface unit may be configured to read a value of the data element. The communication channel may be configured to allow the processing module to read the value of the data element from the interface unit. In addition, the method may include configuring, by the processing module, the interface unit to read or write a value of the data element. Thus, the processing module may read and/or set one or more parameters and/or one or more inputs of the user design, so as to monitor, debug, and/or control the user design.

In another aspect, a method for accessing an external module/device (e.g., a sensor, an actuator, and/or a controller for such devices), by a field programmable gate array (FPGA)-based user design includes the steps of designating a first part of a first FPGA unit to execute at least a portion of a user design, and configuring a first portion of a second part of the first FPGA unit as a first interface unit for exchanging data between the user design and a first external module/device. The method also includes establishing, by a controller of the first FPGA unit, a first communication channel between the first interface unit and the first external module/device.

The user design may be independent of, e.g., not based on, any structure and any operation of the first external module/device. The first interface unit may include a logical representation of the first external module/device. In some embodiments, the method includes configuring a second portion of the second part of the first FPGA unit as a second interface unit for exchanging data between the user design and a second external module, e.g., another sensor, another device controlled by the user design, etc. The method may also include establishing, by the controller of the first FPGA unit, a second communication channel between the second interface unit and the second external module.

In some embodiments, the method includes designating a first part of a second FPGA unit to execute at least a portion of the user design, and configuring a first portion of a second part of the second FPGA unit as a second interface unit for exchanging data between the user design and a second external module. The method may also include establishing, by a controller of the second FPGA unit, a second communication channel between the second interface unit and the second external module, and establishing, by an external controller, a communication link between the first and second FPGA units through respective input/output (I/O) interfaces thereof. In this way, the FPGA system can be scaled as necessary according to the characteristics of the user design, by including two or more FPGA units that are in electrical communication with each other, and can execute respective portions of the overall user design/application.

These and other objects, along with advantages and features of the embodiments of the present invention herein disclosed, will become more apparent through reference to the following description, the accompanying drawings, and the claims. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
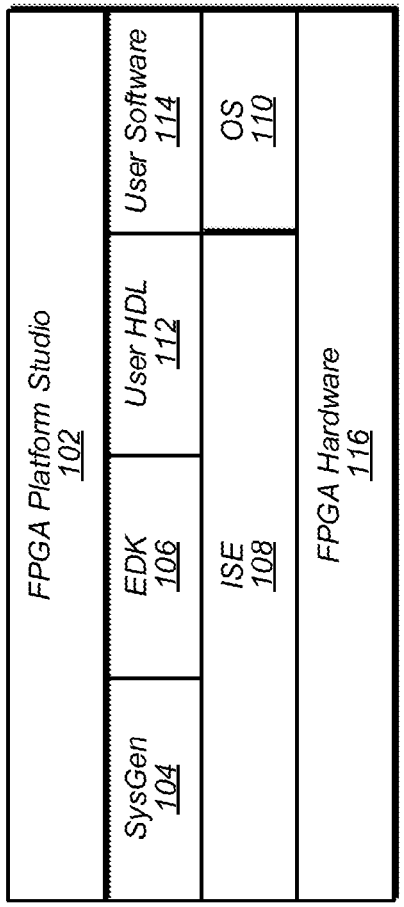
FIG. 1 schematically depicts typical components of an FPGA design environment, according to one embodiment.

Various embodiments of an FPGA Platform Studio (or FPS) provide a system-level, hardware/software co-development environment that may be operated along with another system design environment, such as the MathWorks™ Simulink™ framework. Referring to FIG. 1, for mapping designs to FPGA hardware, an embodiment of an FPS 102 uses vendor specific tools. The FPS 102 provides automatic generation of various platform specific hardware interfaces and corresponding software drivers, as well as a direct algorithm-to-implementation conversion without requiring user knowledge of the low level implementation details of the external hardware modules/devices accessed by the algorithm. To this end, the FPS 102 may use modules such as SysGen 104, EDK 106, and ISE 108, and the operating system (OS) 110, to map an algorithm specified by a user via User HDL 112 (i.e., a hardware description language specification of an algorithm and/or a system) and other user software 114 to the FPGA hardware 116 of a selected FPGA platform. The details of the mapping are described below with reference to FIG. 4.

Figure 2:
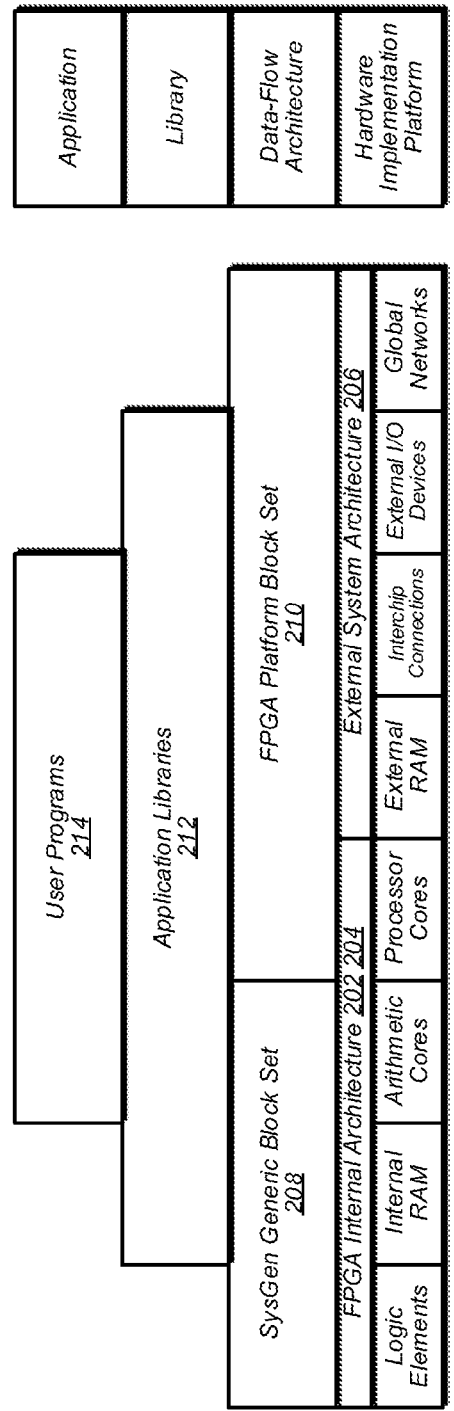
FIG. 2 schematically depicts an exemplary hardware and software architecture within which various embodiments of design and operating environments can be deployed.

Referring to FIG. 2, an embodiment of an FPS facilitates configuration of a collection of hardware devices and provides associated software tailored for use on a specific FPGA-based system. The FPS design environment can abstract hardware-specific details away from the end user and, thus, can accelerate the design of the user application. The smallest unit of the FPS design environment can be a single FPGA unit.

A typical design in an FPS design environment starts with the core algorithm design in another design environment (e.g., Simulink™ with Xilinx™ System Generator for DSP (XSG)). Though the discussion herein is based on Simulink™ and XSG, other design environments in conjunction with the design systems of different FPGA vendors are also within the scope of various embodiments. From the end-user perspective, Simulink™ designs only exist in an idealized sandbox with the synchronous data flow execution model. Various connections outside the core algorithm, e.g., to exchange information with external modules/devices, are virtually mapped through FPS interface blocksets. The FPS blocksets may be created by FPGA experts in addition to or to replace generic XSG "gateways" as interfaces between the core algorithm design in Simulink™ and external system-level modules/devices. A processor core, typically the MicroBlaze™ soft-core processor or the ARM™ hardcore, is implicitly included in various FPS designs. The processor core can communicate with the user design through a variety of shared memory components, such as software registers, Block RAMs, FIFOs, or DRAM. Users can specify the desired data structure by selecting the corresponding FPS blockset in Simulink™. Various external network, input/output (I/O), and memory devices may be abstracted as Simulink™ data sources or sinks with a simple FIFO communication protocol.

For various supported hardware platforms, an FPS framework can provide base packages as complete Xilinx™ Embedded Development Kit (EDK) projects, as well as a corresponding Simulink™ FPS blockset with interface options for various external devices. Base packages for design environments other than Simulink™ and/or for FPGA configuration and design systems of vendors other than Xilinx™ are also contemplated. A base package may include all of the essential system device IP cores, an initial hardware system configuration, and an extensible embedded software environment also called an operating environment (OE). The back-end implementation files for the user-selected external devices may be dynamically generated by the FPS tools on top of the base package, as described below with reference to FIG. 4. These files can be automatically combined and connected with various hardware and software components.

As such, referring again to FIG. 2, in a typical design environment, an FPGA unit 202 of an FPGA platform 204 may include one or more of logic elements, an internal RAM, and one or more arithmetic cores. While the platform 204 includes only one unit, an FPGA platform in general may include several (e.g., 2, 4, 5, 6, 10, 15, 20, 25, 32, etc.) FPGA units. An overall hardware system 206 may include one or more of an external RAM, inter-chip connectors, external I/O devices, and global networks. The FPGA platform 204 may also include one or more of such components. The FPGA-vendor provided design system 208 (e.g., SysGen Generic Blockset from Xilinx™) can be used to configure the hardware components of the FPGA unit 202. Embodiments of the FPS, having blockset libraries 210 as described above, can be used to configure the components of the FPGA platform 204 and various external hardware modules/devices. Application libraries 212 can provide an interface to the user design expressed as a user program 214 to various blocksets via, e.g., application program interfaces (APIs), so that the user design 214 can interact with various hardware components and/or external modules/devices without needing any particular knowledge of the structure and/or operation of those hardware components, modules, and devices.

Figure 3:
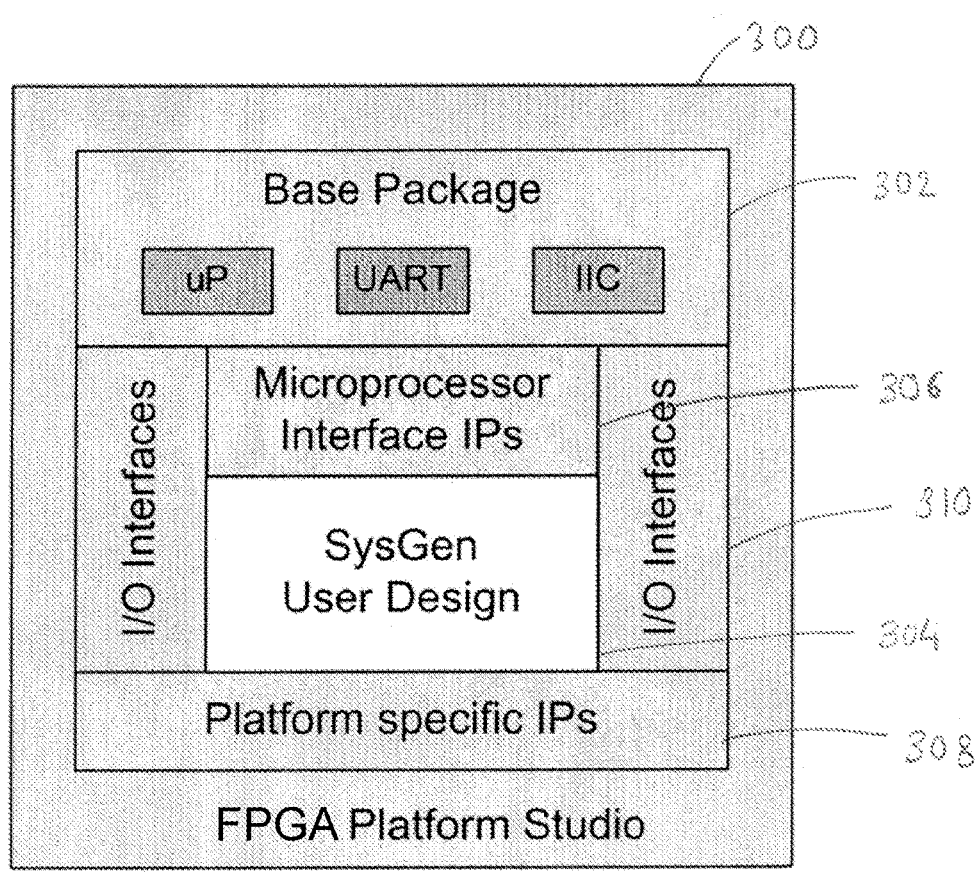
FIG. 3 schematically depicts a design environment, according to one embodiment.

Referring to FIG. 3, in an embodiment of an FPS design environment 300, an FPS base package 302 is a preconfigured Vivado or EDK project created in the Xilinx™ Platform Studio (XPS) format. Base packages can be preconfigured for the design environments of other FPGA vendors as well. The base package 302 includes the infrastructure required to support various available library blocks on a selected hardware platform, i.e., FPGA unit. Embodiments of FPS base packages may be customized for platforms such as BEEcube BEE3™, BEE4™, miniBEE4™, and BEE7™, as well as for the Xilinx™ ML505, ML506, ML507, XUPV5-LX110T (ML509), and ML605 Evaluation Platform boards, and platforms of other FPGA vendors. A typical FPS base package for BEE3™ includes: a MicroBlaze soft processor core for system integration, management, and debugging, a simple, extensible software monitoring and debugging shell (NectarOS shell), a UART for console access to the embedded shell, an IIC controller for reading PROM contents (e.g., FPGA ID, MAC address, etc.), and a 100 MHz crystal input and clock generator for all base infrastructure components.

The FPS 300 design environment can thus be used to facilitate monitoring and/or debugging of a user design 304 by an external processing unit and/or to exchange information between the user design 304 and an external module/device, the structure and operation of which need not be known to the user design 304. To this end, the FPS 300 includes a library 306 of generic interface IPs, which may include the specifications of one or more interface units available on various FPGA platforms. The FPS 300 may also include a library 308 of platform specific IPs, which may include the specification of one or more interface units that are customized for a particular platform. In addition, the FPS 300 includes the base package 302 as described above, and input/output (I/O) interfaces 310, which can be configured for communication between the user design 304 and external processing modules and/or other external modules and/or devices.

Figure 4:
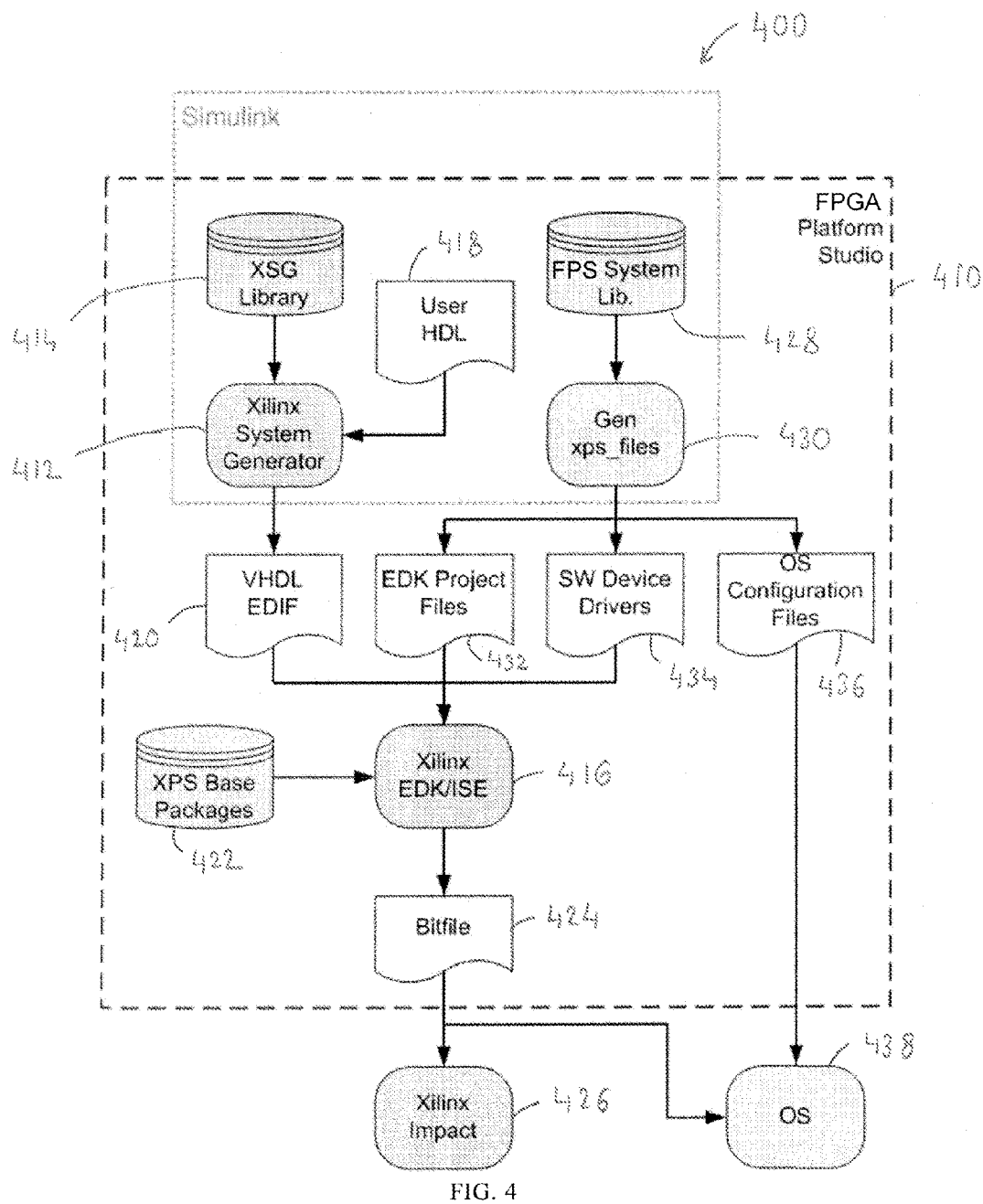
FIG. 4 depicts a process of designing an FPGA-based system using a design environment according to one embodiment.

Referring to FIG. 4, in one embodiment of a design environment (DE) 400, an FPS 410 is a preconfigured Vivado, i.e., the FPS 410 is built on top of FPGA vendor (e.g., Xilinx™) tool flows. While the discussion herein uses a Xilinx™ tool flow as an example, it should be understood that various embodiments of the FPS can operate with the tool flows of other FPGA vendors as well. Typically, the Xilinx™ System Generator (XSG) 412 provides a blockset in an XSG Library 414 for mapping DSP algorithms. In the Simulink™ design environment, each library of blocks is called a blockset. Xilinx™ Embedded Development Kit (EDK) 416 provides microprocessor and system-level integration, and Xilinx™ ISE and Vivado software 416 provides the back-end support for logic synthesis, place and route, and bitfile generation. Typically, a user specifies a user design as one or more high-level description language (HDL) files 418, which the XSG 412 translates into one or more EDIF files 420. The EDIF files together with files from XPS Base Packages 422 are compiled by the EDK/ISE 416 to obtain one or more bitfiles 424 representing the user design that can be used to configure one or more FPGA units, e.g., using the Xilinx™ impact module 426. The bitfiles 424 can be executed by one or more FPGA units.

In a conventional flow, if the user design must interact with external modules such as sensors, devices that are to be controlled using the user design, etc., the user must specify, e.g., in the User HDL 418, the structure and functionality to facilitate communication and exchange of data with the external modules. As such, the user requires knowledge of the structure and/or functionality of the external modules and/or devices. Acquiring such knowledge can be cumbersome and error-prone, and can add to the design cost and time taken to complete a user design.

To facilitate communication with external modules/devices and to allow a user design to control such modules/devices efficiently and to exchange data therewith, in various embodiments, the FPS 410 provides its own blocksets in an FPS System Library 428. The interface units included in the library 428 can abstract away the low-level details of the underlying physical hardware modules/devices with which the respective interface unit can communicate, allowing the user design to communicate only with various data interfaces. Thus, the user design (specified as User HDL 418 and compiled into one or more bitfiles 424) can simply write control information (e.g., device parameters) and/or data to and/or read control information/data from one or more interface units as if writing to and/or reading from a data structure. The interface units may provide application program interfaces (APIs) to this end. The user design need not be aware of any implementation details of the underlying hardware and can be independent of the external modules/devices with which data and/or control information is to be exchanged.

An external processing unit (e.g., a user computer) can also use an interface unit to read data from a user design while the user design expressed as one or more bitfiles 424 is executing on an FPGA unit. The read data can indicate a current state of execution of the user design and can be used to debug the user design. The external processing unit may also supply one or more control parameters/data values via an interface unit to a user design during execution thereof, so as to control the behavior of the user design.

In the Design Environment 400, the Gen xps_files module 430 translates one or more interface unit files selected by a user from the library 428 into corresponding one or more EDK project files 432 and one or more software-based device drivers 434 for the external modules/devices corresponding to the selected interface units. The one or more EDK files 432 and the one or more device drivers 434, together with the one or more EDIF files 420, are compiled by the EDK/ISE 416 into one or more bitfiles 424. The Gen xps_files module 430 may also generate one or more operating system (OS) configuration files 436 that can be used by the OS module 438 to facilitate exchange of data/control information between the selected interface units and the external modules/devices. Various FPS embodiments provide Simulink™ based blocksets for several different FPGA hardware platforms as described below. Platform independent FPS blocksets include: Software Register (with and without strobe); Shared FIFO; Shared BRAM; ChipScope Configuration; and ChipScope Probe.

Blocksets for the BEE3™ platform include: BEE3 Platform Configuration; GPIO; Multi-port Memory Controller; MPMC Direct Interface; MPMC Video Frame Buffer Interface; Ethernet Interface; 10 Gb Ethernet Interface; PCI Express Endpoint; Aurora Streaming Serial LinkHigh-speed Inter-FPGA I/O; ADC Expansion Board Interface; and DAC Expansion Board Interface.

Blocksets for BEE4™ platform include: BEE4 Platform Configuration; GPIO; High-speed Inter-FPGA I/O; FMC101 Expansion Board ADC Interface; FMC101 Expansion Board DAC Interface; FMC104 Expansion Board ADC Interface; FMC105 Expansion Board DAC Interface; FMC111 Control; FMC111 RX Channel; FMC111 TX Channel; CPRI Interface; Ethernet MAC LocalLink; 10 Gb Ethernet Interface; Aurora Streaming Serial Link; XAUI Interface; DDR3 MIG; DDR3 FIFO; FMC DVI Input; and FMC DVI Output.

Blocksets for miniBEE4™ platform include: miniBEE4 Platform Configuration; GPIO; FMC101 Expansion Board ADC Interface; FMC101 Expansion Board DAC Interface; FMC104 Expansion Board ADC Interface; FMC105 Expansion Board DAC Interface; FMC111 Control; FMC111 RX Channel; FMC111 TX Channel; Ethernet MAC LocalLink; 10 Gb Ethernet Interface; RXAUI Interface; Aurora Streaming Serial Link; DDR3 MIG; DDR3 FIFO; FMC DVI Input; and FMC DVI Output.

Blocksets for BEE7™ platform include: BEET Platform Configuration; GPIO; SerDes I/O; FMC104 Expansion Board ADC Interface; FMC105 Expansion Board DAC Interface; FMC108 Expansion Board ADC Interface; FMC108 Expansion Board ADC DES Interface; FMC108 Expansion Board ADC DES 2-to-1 Interface; FMC109 Expansion Board DAC Interface; FMC109 Expansion Board DAC 2to1 Interface; Aurora 64b66b Streaming Serial Link; DDR3 Configuration; and DDR3 FIFO.

Blocksets for Xilinx™ ML50x platform include: ML50x Platform Configuration; PIO; Multi-port Memory Controller; MPMC Direct Interface; MPMC Video Frame Buffer Interface; SRAM Interface; Ethernet Interface; PCI Express Endpoint; Aurora Streaming Serial Link; VGA Analog Video Input; DVI Digital Video Output; Xilinx™ ML60x platform specific blocks; ML60x Platform Configuration; GPIO; Multi-port Memory Controller; MPMC Direct Interface; MPMC Video Frame Buffer Interface; Ethernet Interface; FMC101 Expansion Board ADC Interface; FMC101

Expansion Board DAC Interface; HTG-FMC-SFP-PLUS XAUI Interface; FMC DVI Input; and FMC DVI Output.

Figure 5:
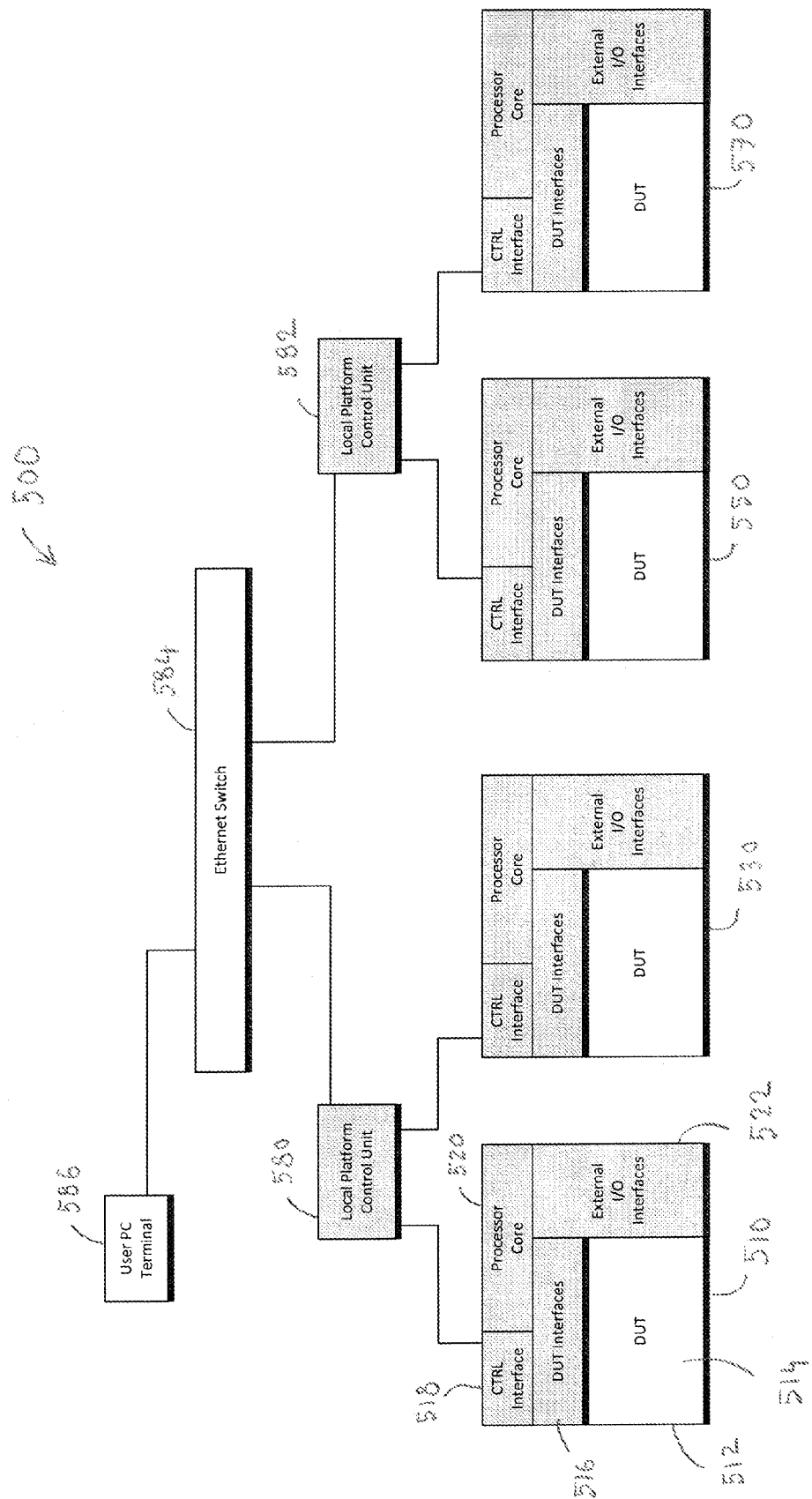
FIG. 5 schematically depicts an FPGA-based system in which an operating environment according to one embodiment is deployed.

With reference to FIG. 5, an embodiment of an Operating Environment (OE) facilitates exchange of data and/or control information between a user design executing on an FPGA unit and an external module/device. Additionally or in the alternative, the OE can facilitate data/control information exchange with one or more processing units, for example, for debugging the user design. In a FPGA-based system 500, an FPGA unit 510 includes a partition 512 where a user design 514, also called design under test (DUT) in the context of debugging, can be loaded and executed. In some embodiments, the partition 512 of the FPGA unit 510 can be configured to execute only a portion of a user design 514. For Xilinx™ FPGAs, the user design is typically specified as one or more bitfiles (e.g., bitfiles in 424 shown in FIG. 4). For FPGAs provided by other vendors, bitfiles or other types of files may be used to load and configure such FPGAs and to execute the user design thereon. The DUT 514 represents the User Design 304 from the FPS 300 design environment depicted in FIG. 3.

The one or more interface units selected and compiled by a user during the design process are loaded into partition 516 as DUT interfaces, which represent the Microprocessor Interface IPs 306 and/or platform specific IPs 308 from the FPS 300 (depicted in FIG. 3). The FPGA unit 510 also includes a control interface 518 and, optionally, a processor core 520. The control interface 518 includes one or more communication mechanisms, e.g., a UART, a bus, etc., and one or more controllers for the communication mechanisms, e.g., an I$^2$C bus controller. The processor core 520 can be a conventional processor or may be a FPGA-based processor, i.e., a portion of the FPGA unit 510 may be configured to operate as a general-purpose processor core 520. In some embodiments, the processor core 520 is externally located from the FPGA unit 510. The control interface 518 and the processor core 520 provide the operating environment (OE), and represent the base package 302 from the FPS 300 (shown in FIG. 3). NectorOS, described below, is one example of the software associated with an OE.

The FPGA unit 510 also typically includes an input/output (I/O) interface 522 for communication with, for example, other FPGA units, external modules/devices with which the DUT 514 may be programmed to communicate, and/or processing modules that can monitor and/or control one or more FPGA units. The I/O interfaces 522 correspond to I/O Interfaces 310 from the FPS 300 (shown in FIG. 3). The system 500 also includes FPGA units 530, 550, and 570, any one of which can establish a direct communication link with any other FPGA unit via the respective I/O interfaces of the two units. Via such communication links, the two FPGA units can exchange data/control information with each other and can execute separate portions of a single user design that may be loaded into respective partitions of the two FPGA units. This allows for a scalable user design. It should be understood that the number of FPGA units in the system 500 is illustrative only and that, in general, a system may include as few as one and as many as 6, 10, 15, 30, 100, 200, or more (e.g., any number of) FPGA units.

The system 500 also includes optional external controllers 580, 582. Each of these controllers can form a local group or a cluster of two or more (e.g., 3, 4, 5, 8, etc.) FPGA units, and can access data associated with the respective DUTs of the FPGA units via the respective DUT interfaces thereof. For example, the external controller 580 can use one or more interface units loaded in the partition 516 to access the data associated with the DUT 514 during execution thereof. In general, an FPGA-based system can include more than two (e.g., 3, 4, 6, 10, 15, etc.) external controllers. The number of FPGA units associated with the different external controllers can be the same or can be different. One or more external controllers can be in electrical communication, e.g., through a switch 584, a proprietary network, the Internet, etc., with one or more user devices such as a personal computer (PC) 586, a tablet, a smart phone, etc., and/or a server. These user devices and/or servers can also access data associated with the respective DUTs of the FPGA units via the respective DUT interfaces thereof. For example, the PC 586 can use one or more interface units loaded in the partition 516 to access the data associated with the DUT 514 during execution thereof.

During operation, the DUT 514 of the FPGA unit 510 can read information from and/or write information to an external module/device, without needing any special knowledge of the external module/device. To this end, the DUT 514, using an API provided by an interface unit in the partition 516, can read a value from and/or write a value to an interface unit (such as a register, FIFO, shared memory, etc.). The OE provided by the control interface 518 and the processor core 520 has the knowledge of the external module/device associated with the particular interface unit and can establish a required communication channel, including the required communication protocols, between the interface unit and the external module/device via, e.g., a system bus and/or the I/O interface 522. The required information can then be accessed from the external module/device via the communication channel under the control of the OE and may be supplied to the corresponding interface unit, so that the DUT 514 can read such information. Similarly, the information stored in the interface unit by the DUT 514 can be accessed from the communication channel under the control of the OE and may be supplied to the external module/device, so that the DUT can control the external module/device.

A processing module can also use one or more interface units, e.g., for monitoring, debugging, etc. the one or more DUTs. For example, the PC 586 can communicate with the control interface 518 and, using the OE, employ one or more interface units in the partition 516 to access information from the DUT 514. The PC 586 can then use this information to monitor the execution of the DUT 514 and/or to debug such execution. Using the OE, the processing unit may also write one or more values, such as user design inputs and/or control parameters, via one or more interface units in the partition 516, to control the execution of the DUT 514.

In some embodiments, the NectarOS embedded shell is included as the default software environment for all FPGA implementations. Provided below is a description of the NectarOS commands which are created by an embodiment of an FPS. Note that in addition to the intrinsic commands listed below, many FPS blocks also provide their own runtime commands. Those commands are only added to the shell if one or more of the corresponding blocks are present in the design. The commands listed here are typically included with NectarOS, regardless of which types of cores/platforms are being used in a particular design. Typical NectarOS commands include:

help—Will print a list of helpful information (keystrokes, commands, etc.) for using NectarOS.

write—Will write one value to a given memory location. The access type argument determines the size of the data operation, which can be either b (byte, or 8-bit), s (short, or 16-bit), or l (long, or 32-bit).

readrtc—Will read all the registers in the Real-Time Clock (RTC) chip and print the results to the console. The output will include the status of all configuration registers, as well as the current date and time in the proper format.

i£ijtime—Will set the current time of day in the RTC chip. The argument to this command must be in the format HH:MM:SS, where HH is the current hour in 24-hour format, and MM and SS are the minutes and seconds, respectively.

date—Will set the current date in the RTC chip. The argument to this command must be in the format MM-DD-YYYY, where MM is the month, DD is the day, and YYYY is the year.

day—Will set the current day of the week in the RTC chip. The argument to this command must be a two-character string from the list: Mo, Tu, We, Th, Fr, Sa, Su.

readprom—Will read a single byte from the EEPROM chip at the PROM address specified. The byte value will be printed to the console.

writeprom—Will write the given byte value to the user space of the EEPROM chip at the PROM address specified. On BEE3™ platforms, the lower 128 bytes of the EEPROM are reserved for system use, and attempts to write to these addresses will be denied. On ML50x platforms, extreme care should be taken not to write into the factory-programmed address locations, as the factory PROM layout is expected to exist in other NectarOS routines.

bee3_info—Will print out information about the BEE3™ system and FPGA on which the shell is running.

bee4_info—Will print out information about the BEE4™ system and FPGA on which the shell is running.

listdev—Will print out a list of all the FPS-generated cores in the design and their corresponding base addresses.

jc_spi_write—Lets the user manually edit the registers of the jitter cleaner for BEE7™.

jc_macro_write—Has several different macros for configuring the jitter cleaner.

jc_set_input_freq_cmd—Configures the jitter cleaner based on the input frequency given in kHz. For additional configuration of the jitter cleaner, the user can set the pdf frequency and charge pump current as well.

jc_show_reg_vals_cmd—Shows the current register settings of the jitter cleaner.

jc_enable_sma_cmd—Will enable or disable the jitter cleaner output to the SMA.

jc_set_output_freq_cmd—Sets the jitter cleaner output frequency for the g-th reference or for the SMA output.

jc_get_status_cmd—Reports whether the jitter cleaner is locked or not.

In summary, various embodiments of an FPS provide the user with at least three sets of features to stream-line the hardware design process. First is a collection of libraries which provide simple, easy-to-use design abstractions for several internal and external data interfaces available on various supported hardware platforms. Second is an automated hardware/software generation flow which converts an algorithm into an FPGA implementation as a standard Xilinx™ EDK project or similar data files of other FPGA vendors. Third is an extensible software environment or operating environment (e.g., the NectarOS embedded shell) that can provide runtime access to on-chip data resources for convenient system monitoring and/or debugging of the user design directly, as it is executed by an FPGA unit.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A field programmable gate array (FPGA)-based scalable system, comprising:
   a first FPGA unit, comprising:
      a partition for a user design;
      a reconfigurable interface that is: (i) implemented using FPGA reconfigurable circuits, and (ii) configured to exchange data with the user design and each of a first interface unit and a second interface unit; and
      a control interface configured to establish a first communication channel between the first interface unit and a first external module and a second communication channel between the second interface unit and a second external module; and
      a processing module configured to run an operating environment that interfaces with the user design and observes and controls the user design during execution of the user design by the first FPGA unit.

2. The system of claim 1, wherein the first interface unit comprises at least one of a register, a first in first out (FIFO) buffer, and a random access memory (RAM).

3. The system of claim 1, wherein the first interface unit is customized for the first FPGA unit.

4. The system of claim 3, wherein the first interface unit comprises at least one of a network input/output device, a serial communication device, a buffer, and a memory controller.

5. The system of claim 1, wherein the control interface communicates with the first external module via an Ethernet switch.

6. The system of claim 1, wherein the processing module comprises an FPGA based soft processor core or a hard processor core.

7. The system of claim 1, wherein the first FPGA unit further comprises an input/output (I/O) interface, the system further comprising:
   a second FPGA unit; and
   an external controller in electrical communication with the first FPGA unit and with the second FPGA unit.

8. The system of claim 7, wherein the external controller is configured to access the reconfigurable interface of the first FPGA unit and a reconfigurable interface of the second FPGA unit.

9. The system of claim 7, wherein the external controller is configured to establish a communication link between the first and second FPGA units through respective I/O interfaces thereof.

10. A method for analyzing a field programmable gate array (FPGA)-based user design, the method comprising the steps of:
   designating a first part of an FPGA unit to execute a user design;
   configuring a second part of the FPGA unit as a first interface unit a second interface unit for accessing a data element of the user design, wherein the second part of the FPGA unit is included in an operating environment executing on the FPGA unit;
   establishing, by a control interface, a communication channel between each of the first interface unit and a first external module and a second interface unit and a second external module; and running, by a processing module, the operating environment, wherein the operating environment interfaces with the user design and observes and controls the user design during execution of the user design by the FPGA unit.

11. The method of claim 10, wherein:
the first interface unit is configured to read a value of the data element; and
establishing the communication channel comprises allowing the processing module to read the value of the data element from the first interface unit.

12. The method of claim 10, further comprising configuring, by the processing module, the first interface unit to read or write a value of the data element.

13. A method for accessing a first and a second external module by a field programmable gate array (FPGA)-based user design, the method comprising the steps of:
designating a first part of a first FPGA unit to execute at least a portion of a user design;
configuring a first portion of a second part of the first FPGA unit as a first interface unit for exchanging data between the user design and a first external module, wherein the second part of the FPGA unit is included in an operating environment executing on the FPGA unit;
configuring a second portion of the second part of the first FPGA unit as a second interface unit for exchanging data between the user design and a second external module;
establishing, by a control interface of the first FPGA unit, a first communication channel between the first interface unit and the first external module;
establishing, by the control interface of the first FPGA unit, a second communication channel between the second interface unit and the second external module; and
running, by a processing module, the operating environment, wherein the operating environment interfaces with the user design and observes and controls the user design during execution by the FPGA unit.

14. The method of claim 13, wherein:
the user design is independent of a structure and an operation of the first external module.

15. The method of claim 13, further comprising:
designating a first part of a second FPGA unit to execute at least a portion of the user design;
configuring a first portion of a second part of the second FPGA unit as a second interface unit for exchanging data between the user design and a second external module;
establishing, by a control interface of the second FPGA unit, a second communication channel between the second interface unit and the second external module; and
establishing, by an external controller, a communication link between the first and second FPGA units through respective input/output (I/O) interfaces thereof.

\* \* \* \* \*